United States Patent
Gardner et al.

[11] Patent Number: 6,160,300
[45] Date of Patent: Dec. 12, 2000

[54] MULTI-LAYER GATE CONDUCTOR HAVING A DIFFUSION BARRIER IN THE BOTTOM LAYER

[75] Inventors: Mark I. Gardner, Cedar Creek; Derick J. Wristers, Austin, both of Tex.; Charles E. May, Gresham, Oreg.

[73] Assignee: Advanced Micro Devices, Inc., Sunnyvale, Calif.

[21] Appl. No.: 09/238,081

[22] Filed: Jan. 26, 1999

[51] Int. Cl.[7] .......................... H01L 29/76; H01L 29/94; H01L 31/062; H01L 31/113; H01L 31/119

[52] U.S. Cl. .......................... 257/412; 413/366; 413/250; 413/52; 413/751

[58] Field of Search .......................... 257/250, 366, 257/412, 413, 751, 52–63

[56] References Cited

U.S. PATENT DOCUMENTS

| | | | |
|---|---|---|---|
| 4,613,402 | 9/1986 | Losee et al. | 156/643 |
| 5,276,347 | 1/1994 | Wei et al. | 257/388 |
| 5,393,676 | 2/1995 | Anjum et al. | 437/24 |
| 5,468,974 | 11/1995 | Aronowitz et al. | 257/51 |
| 5,514,902 | 5/1996 | Kawasaki et al. | 257/607 |
| 5,633,177 | 5/1997 | Anjum . | |
| 5,796,166 | 8/1998 | Agnello et al. | 257/751 |

OTHER PUBLICATIONS

Lee et al. ("Argon ion–implantation on polysilicon or amorphous–silicon for boron penetration suppression in p+ pMOSFET", IEEE Transactions on Electron Devices, vol. 45, Issue 8, Aug. 1998, pp. 1737–1744).

*Primary Examiner*—David Hardy
*Assistant Examiner*—Jesse A. Fenty
*Attorney, Agent, or Firm*—Kevin L. Daffer; Conley, Rose & Tayon

[57] ABSTRACT

A fabrication process and transistor are described in which a transistor having a diffusion barrier located in the bottom layer of a stacked (i.e., multi-layer) gate conductor is formed, thereby reducing the diffusion of dopants from the gate conductor to the underlying channel region. In a general embodiment, multiple gate conductor layers are formed and arranged in a vertical stack, and a diffusion barrier is introduced into one or more layers of the stack. In a preferred dual-layer embodiment, a first gate conductor layer (i.e., the bottom layer) having a first thickness is deposited upon a gate dielectric layer. An argon distribution is then introduced into the first gate conductor layer to form an argon diffusion barrier in the first gate conductor layer. A second gate conductor layer having a second thickness is then deposited upon the first gate conductor layer. The second thickness is preferably greater than the first thickness, which in turn is greater than the thickness of the argon diffusion barrier residing within the first gate conductors layer. The thickness of the first gate conductor layer is controlled to facilitate location of the diffusion barrier, thereby presenting numerous advantages over conventional barrier formation techniques.

9 Claims, 2 Drawing Sheets

MULTI-LAYER GATE CONDUCTOR HAVING A DIFFUSION BARRIER IN THE BOTTOM LAYER

BACKGROUND OF THE INVENTION

1. Field of the Invention

This invention relates generally to fabrication of integrated circuits, and more particularly to providing an improved gate conductor for enhanced transistor operation by introducing a diffusion barrier into the bottom layer of a stacked gate conductor.

2. Description of the Related Art

MOSFETs (metal-oxide-semiconductor-field-effect transistors) are the basic building blocks of modern integrated circuits. The conventional fabrication of MOSFET devices is well known. Typically, MOSFETs are manufactured by depositing an undoped polycrystalline silicon ("polysilicon") material over a relatively thin gate oxide arranged above a semiconductor substrate. The polysilicon material and the gate oxide are patterned to form a gate conductor arranged between a source region and a drain region. The gate conductor and source/drain regions are then implanted with an impurity dopant. If the dopant species employed for forming the source/drain regions is n-type, then the resulting MOSFET is an NMOSFET (n-channel) transistor device. Conversely, if the source/drain dopant species is p-type, then the resulting MOSFET is a PMOSFET (p-channel) transistor device. Integrated circuits utilize either n-channel devices exclusively, p-channel devices exclusively, or a combination of both on a single monolithic substrate.

The number of transistors per unit area in modern semiconductor devices continues to increase. Commensurately, device geometries continue to decrease. Moving to smaller device dimensions exacerbates some common problems encountered in transistor fabrication. One such problem shared by all MOS transistor devices is unwanted impurity diffusion from the source/drain regions. As is well known in the art, impurities are used to augment carrier transport and electrical performance in transistors. Controlled diffusion of impurities can be an important step in a process flow. Thus, thermal diffusion is often required subsequent to implanting source/drain regions in order to activate dopants and repair lattice damage. However, unwanted migration or diffusion can occur during processing or transistor operation that degrades performance. Problems associated with diffusion, both in the lateral and vertical dimensions, become more acute as device geometries shrink. One important lateral dimension is the channel length of transistor, which is defined by the spacing between the source and drain regions. One problem associated with small channel lengths is short channel effects, which impact device operation by reducing threshold voltages and increasing sub-threshold currents. Generally, short channel effects are exacerbated by lateral diffusion caused by thermal steps in a process flow.

The drawbacks associated with diffusion from source/drain regions are more pronounced in PMOS devices. This is attributable to the differences in the characteristics of the typical impurities used in NMOS and PMOS devices. Arsenic is generally used to form source/drain regions in NMOS transistors. Heavy As atoms diffuse relatively slowly in silicon, thereby allowing source/drain regions doped with As to remain relatively shallow during high temperature anneal steps that must be performed subsequent to source/drain implantation. Additionally, the implantation of heavy arsenic atoms tends to amorphize the silicon in the source/drain regions. Amorphization decreases diffusion by inhibiting channeling. Channeling can occur when ions are forwarded into single crystal lattices, such as silicon, because there are some crystal directions, so called "channels," along which the ions will not encounter any lattice nuclei. Implanted ions traveling along channels are stopped principally by electronic stopping. Consequently, the ions can penetrate the lattice to a much greater depth than in amorphous targets. In contrast, boron, which is a light atomic species, is generally used to dope PMOS source/drain regions. Lighter boron atoms diffuse relatively fast in silicon and do not amorphize silicon upon implantation. The channeling problem can be partially solved by using boron difluoride ($BF_2$) as the implant species. However, use of $BF_2$ does not reduce the problem of boron diffusion. Inhibition of boron diffusion is usually accomplished with a diffusion barrier. Common barrier species include nitrogen, argon, and germanium.

Vertical diffusion in gate conductors presents another problem affecting the performance of modern MOS devices. As mentioned above, a gate conductor is typically formed by patterning a layer of polysilicon deposited over a thin gate dielectric. Impurities are often introduced into a gate conductor by implantation to increase the electrical properties of the polysilicon. Boron is a typical candidate. A boron implant into the gate conductor may be performed as a separate step. Alternatively, in PMOS devices boron may be introduced into the gate conductor during the formation of source/drain regions where the gate conductor is used to align the source/drain implants. A $p^+$ dopant of boron may penetrate, diffuse, or migrate through the thin gate dielectric from the gate conductor to the underlying channel region. Proper operation of a PMOS device requires maintaining a closely controlled n-dopant level in the channel region. Boron introduction into the channel region of a PMOS device will cause a change in the n-dopant concentration. Even a slight change in the channel concentration will adversely shift the threshold voltage, VT, of the device. Therefore, in designing a PMOS device, not only must the lateral and vertical diffusions out of the source/drain regions be minimized and controlled as described above, but the outdiffusion of boron from the polysilicon gate conductor through the thin gate dielectric must also be minimized and controlled.

One approach to inhibiting vertical diffusion of boron from a gate conductor is to mask the gate conductor prior to doping the source and drain regions. For example, titanium silicide deposited on the upper surface of the gate conductor will substantially block boron (or $BF_2$) from being implanted into the gate: Absence of boron (or $BF_2$) in the gate conductor will therefore ensure that it will not subsequently enter the channel via the gate. However, titanium silicide selectively placed across only the gate conductor region before source/drain implantation generally requires a separate masking step and associated photolithography. Moreover, the masking step must eventually be repeated in order to provide a high conductivity over the source/drain contacts after the source/drain regions are implanted. Requiring two photolithography steps and associated masks can prove problematic and should in most cases be avoided if only one step is needed. Alternatively, titanium silicide can be placed across the entire active area (gate and source/drain regions) prior to a high-energy implantation through the silicide. Blanket deposition of titanium silicide in the active regions follows normal processing flow without requiring additional masks or steps. However, blanket deposition and subsequent high-energy implantation cannot ensure $BF_2$ is prevented from entering the gate while permitting accurate (e.g., shallow) implantation into the source/drain.

Another approach to inhibiting vertical diffusion of boron from a gate conductor is to provide a diffusion barrier within the gate. Germanium atoms have been used to form such a barrier. A diffusion barrier may be formed by a blanket implantation of germanium ions to a depth below the subsequently implanted boron ions. Placement of the germanium barrier in the gate conductor intermediate the gate oxide and the boron implant substantially prevents or retards penetration or migration of the boron ions from the gate conductor into the underlying channel region. However, optimal functionality of the diffusion barrier hinges on carefully locating the germanium ions at the proper depth within the gate. Moreover, the germanium ion distribution must be relatively dense in order (i.e., the germanium ions must be arranged fairly close to one another) to effectively inhibit diffusion and channeling of the boron ions. Controlling the density and depth of the implant becomes more difficult as the desired depth of the diffusion barrier increases. It would be advantageous to be able to more accurately control the location and density of the diffusion barrier within the gate conductor.

SUMMARY OF THE INVENTION

The problems outlined above are overcome by using a stacked (i.e., multi-layer) gate conductor and introducing a diffusion barrier species into the bottom layer of the stack. Nitrogen, germanium, and argon are suitable diffusion barrier species, with argon being the preferred species. Optimal barrier performance requires accurate placement of a barrier of non-dopant (i.e., electrically neutral) atoms having sufficient density within the gate conductor. In striving towards this goal, conventional methods for manufacturing diffusion barriers may be limited because such methods rely on implantation directly into the full vertical thickness of the gate conductor. However, in the presently disclosed stacked gate conductor, the thickness of the bottom layer of the stack is controlled to facilitate location of the diffusion barrier, thereby presenting numerous advantages over conventional barrier formation techniques.

Broadly speaking, a method is contemplated for reducing the diffusion of dopants from a gate conductor to an underlying channel region. In a general embodiment, multiple gate conductor layers are formed and arranged in a vertical stack, and a diffusion barrier is introduced into one or more layers of the stack. The diffusion barrier is preferably introduced into a lower, or lowermost layer of the stack. The number of gate conductor layers must be equal to or greater than two, with the preferred number being equal to two. In a preferred dual-layer embodiment, a gate dielectric layer is formed upon an upper surface of a semiconductor substrate. Next, a first gate conductor layer having a first thickness is deposited upon the gate dielectric layer, thereby forming an interface between the first gate conductor layer and the gate dielectric layer. An argon distribution may then be introduced into the first gate conductor layer to form an argon diffusion barrier in the first gate conductor layer. A second gate conductor layer having a second thickness is then deposited upon the first gate conductor layer. The second thickness is preferably greater than the first thickness, which in turn is greater than the thickness of the argon diffusion barrier residing within the first gate conductors layer.

Polysilicon and amorphous silicon are the preferred materials for the gate conductor layers. The first gate conductor layer may include silicon deposited in either a polycrystalline or amorphous form. Selecting between the two forms depends on the deposition conditions such as temperature. At temperatures below approximately 580° C., a silicon layer will deposit with an essentially amorphous structure; whereas, at temperatures above 580° C., the as-deposited layer will tend to have a polycrystalline structure. Thus, in one embodiment, depositing the first gate conductor layer includes depositing an amorphous silicon layer at a temperature below the threshold temperature. In an alternative embodiment, the first gate conductor layer is formed by depositing a polysilicon layer at a temperature above the threshold temperature. One advantage of using amorphous silicon for the first gate conductor layer is that a subsequent implantation or diffusion of argon, to form the argon diffusion barrier, may distribute more uniformly and densely in amorphous silicon than in polysilicon. The second gate conductor layer may be formed using the same deposition techniques generally available for formation of the first gate conductor layer. Thus, a number of combinations of silicon structures are available for formation of the two gate conductor layers. In a preferred dual-layer embodiment, the first gate conductor layer is deposited as amorphous silicon while the second gate conductor layer is deposited as polysilicon. Subsequent high temperature steps in a processing flow incorporating the disclosed method will transform the amorphous silicon into polysilicon; however, polysilicon crystallized from amorphous silicon will tend to have larger grain sizes than in as-deposited polysilicon.

Introducing the argon distribution into the first gate conductor layer may be accomplished by forming the first gate conductor layer in the presence of a gas containing argon. Alternatively, the argon may be introduced following the formation of the first gate conductor layer by either diffusion or, more preferably, implantation. Implantation is the preferred method for forming the argon diffusion barrier because the thickness of the barrier can be made less than the thickness of the first gate conductor layer. Formation of the argon diffusion barrier via implantation entails implanting an argon distribution into the upper surface of the first gate conductor layer to a peak concentration density at a specified depth within the first gate conductor layer. In order to achieve a desired dopant profile for the diffusion barrier, a series of implants over a range of energies may be required. The first thickness of the first gate conductor layer serves as an upper bound for controlling the thickness of the argon diffusion barrier. Therefore, the argon diffusion barrier may extend throughout the first gate conductor layer, but is more suitably confined to a thin layer within the first gate conductor layer, preferably proximate the lower surface of the first gate conductor layer.

The presently disclosed multi-layer embodiment presents a number of advantages over previous attempts to utilize diffusion barriers in gate conductors. One advantage is more precise location of the diffusion barrier within the gate conductor is possible. This follows from the flexibility to choose the layer in which to introduce the argon diffusion barrier and from the ability to regulate the thickness of the diffusion barrier by controlling the thickness of the first gate conductor layer. The thickness of the diffusion barrier also depends on the implant energies. Controlling implant energies is the means by which depth is controlled according to conventional method for locating diffusion barriers in gate conductors. However, a more accurate placement is possible when implanting into a thin gate conductor layer as opposed to implanting into the full vertical thickness of a gate conductor. Another advantage is that the density of the distribution can be more accurately controlled to ensure that the argon atoms are closely spaced. The relatively thin first gate conductor can be heavily doped to achieve an argon density necessary to provide a sufficient barrier against diffusion of impurities out of the gate conductor.

An integrated circuit is also contemplated having one or more transistors featuring a diffusion barrier located within a layer of a stacked gate conductor. The diffusion barrier preferably includes argon. An embodiment features a gate dielectric layer disposed superjacent to a semiconductor substrate. The substrate preferably includes single crystal silicon. Two or more gate conductor layers are arranged in a vertical stack above the gate dielectric layer. Ideally, the argon diffusion barrier is positioned in the bottom layer of the stack. The preferred number of gate conductor layers is two. In a preferred dual-layer embodiment, a first gate conductor layer having a first thickness lies on the gate dielectric layer, thereby defining an interface between the gate dielectric layer and the first gate conductor layer. The argon diffusion barrier is located in the first gate conductor layer, preferably proximate the interface between the gate dielectric layer and the first gate dielectric. The argon diffusion barrier may extend throughout the first gate conductor layer. A second gate conductor layer having a second thickness is positioned above the first gate conductor layer. The second thickness is generally greater than the first thickness. The second gate conductor layer preferably includes polysilicon, while the first gate conductor layer may include either amorphous silicon or polysilicon. In an embodiment where both layers are polysilicon, the first gate conductor layer includes a first polysilicon and the second gate conductor layer includes a second polysilicon, wherein the average grain size of the first polysilicon is preferably larger than the average grain size of the second polysilicon.

BRIEF DESCRIPTION OF THE DRAWINGS

Other objects and advantages of the invention will become apparent upon reading the following detailed description and upon reference to the accompanying drawings in which.

Figure 1:
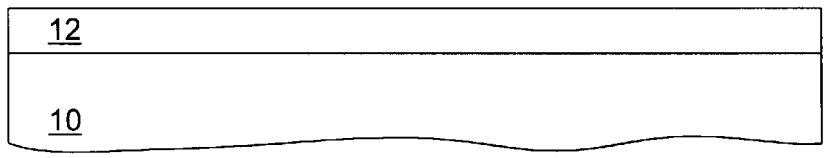
FIG. 1 is a partial cross-sectional view of a semiconductor topography of a preferred embodiment wherein a gate dielectric is formed over a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 shows gate dielectric layer 12 formed on an upper surface of semiconductor substrate 10. An ideal material for semiconductor substrate 10 is lightly doped p-type or n-type single crystal silicon. In a preferred embodiment, gate dielectric layer 12 is a single gate oxide layer. The gate oxide layer may include thermally grown silicon dioxide. Alternatively, the gate oxide layer may include silicon dioxide formed by deposition from a TEOS source or a silane and oxygen bearing source. Yet another embodiment contemplates that gate dielectric layer 12 includes multiple layers, such as a silicon nitride layer deposited over an oxide layer.

Figure 2:
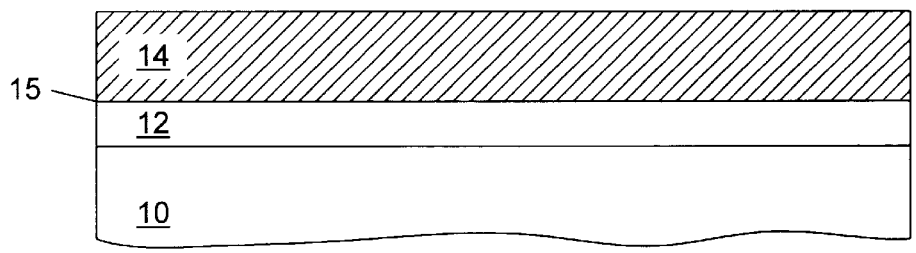
FIG. 2 is a partial cross-sectional view of the semiconductor topography in which a first gate conductor layer has been formed over the gate dielectric layer.

FIG. 2 illustrates first gate conductor layer 14 is formed on gate dielectric layer 12, thereby defining interface 15 at the juncture between the two layers. First gate conductor layer 14 is preferably a thin layer, having a first thickness $t_1$, composed of a material including either polysilicon or amorphous silicon. One advantage of using amorphous silicon for first gate conductor layer 14 is that a subsequent implantation or diffusion of argon (to form the argon diffusion barrier) may distribute more uniformly and densely in amorphous silicon than in polysilicon. Formation of first gate conductor layer 14 entails deposition of the amorphous silicon or polysilicon according to a conventional method, such as low pressure chemical vapor deposition ("LPCVD"). As is well known in the art, rendering the as-deposited silicon material conductive may require further steps, such as implantation and anneal. The deposition conditions will determine whether the deposited silicon material is amorphous or polycrystalline. At temperatures above 580° C., the layer deposits as polycrystalline, while at temperatures below 580° C., the as-deposited film is amorphous. During subsequent high temperature steps in the process flow, the amorphous silicon will crystallize, producing a polysilicon with an average grain size somewhat larger than in the as-deposited polycrystalline film. Larger grain size implies fewer boundaries between adjacent grains resulting in a lower resistivity attributable to a smaller number of boundaries available for trapping mobile charge carriers.

Figure 3:
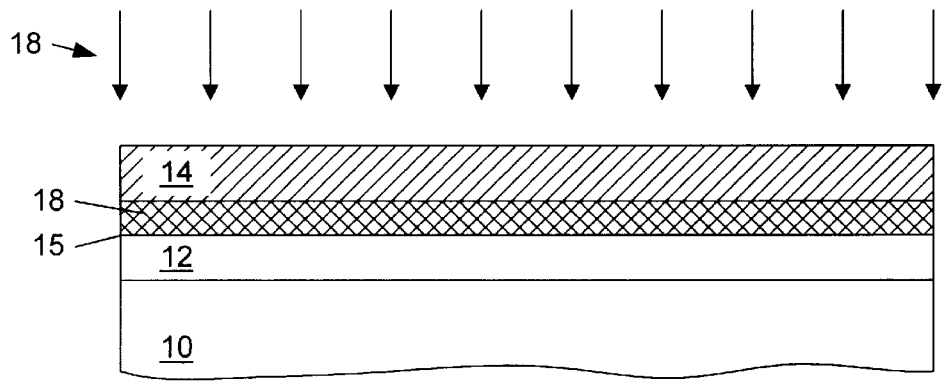
FIG. 3 is a partial cross-sectional view of the semiconductor topography in which an argon diffusion barrier is introduced into the first gate conductor layer.

The formation of argon diffusion barrier 18 is illustrated in FIG. 3, which shows argon being introduced into first gate conductor 14 via step 16. Step 16 may include forming first gate dielectric layer 14 in the presence of a gas containing argon. Alternatively, step 16 may include diffusing argon into an upper surface of first gate conductor layer 14. Both of these embodiments (i.e., argon diffusion and formation of the gate conductor layer in the presence of argon) result in the dimensions of argon diffusion barrier 18 extending throughout first gate conductor layer 14.

In order to achieve a diffusion barrier with a thickness smaller than the thickness of first gate conductor layer 14, step 16 is preferably an argon implantation. Argon implant 16 may include a single implant or multiple implants across a range of energies. The thickness of argon diffusion barrier 18, $d_1$, may be less than the thickness of first gate conductor 14. Thus, in one embodiment, argon diffusion barrier 18 is a thin film, ideally located proximate interface 15. Alternatively, argon implant 16 can be carried out so that argon diffusion barrier 18 extends throughout first gate conductor 14. In the case where the diffusion barrier and the recipient gate conductor layer are coextensive, the formation of argon diffusion barrier 18 may require that argon implant 16 be a multiple implant process. For a diffusion barrier formed by implantation, the implant energy and dose are preferably adjusted such that the peak concentration level of argon implant 16 is at $d_1/2$. For a single implant, the implant depth, $d_1/2$, is measured from the lower surface of first gate conductor 14, which coincides with interface 15, to the peak concentration of argon in argon diffusion barrier 18. Thus, assuming a symmetric implant profile, the thickness of argon diffusion barrier 18 is equal to $d_1$. In a thin film embodiment, argon implant 16 may go to any depth in first gate conductor layer 14, but is preferably located proximate interface 15. In either case, the thickness of first gate conductor layer 14 provides an upper bound on the thickness of argon diffusion barrier 18.

Figure 4:
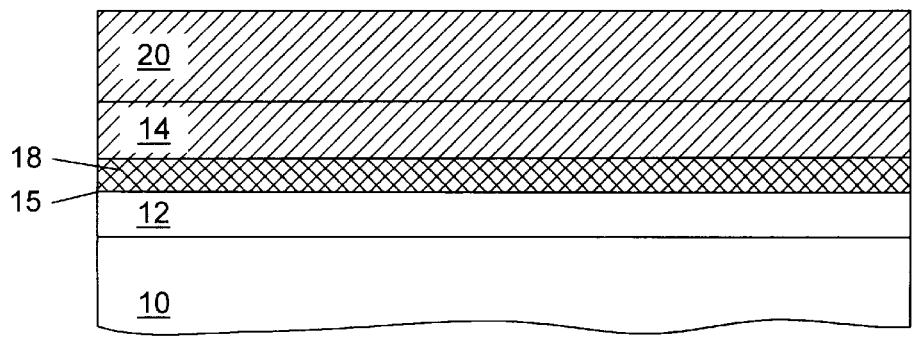
FIG. 4 is a partial cross-sectional view of the semiconductor topography wherein a second gate conductor layer is formed over the first gate conductor layer.

As is shown in FIG. 4, second gate conductor layer 20 is formed upon the upper surface of first gate conductor layer 14. Second gate conductor 20 is formed from either polysilicon or amorphous silicon according to standard deposition methods to a second thickness, $t_2$, which is preferably greater than $t_1$. In a preferred dual-layer embodiment, first gate conductor layer 14 is deposited as amorphous silicon while second gate conductor layer 20 is deposited as polysilicon. Varying the individual thickness of the gate conductor layers allows more precise control of the diffusion barrier than would be possible with standard techniques that rely on implantation directly into a single layer gate conductor.

Figure 5:
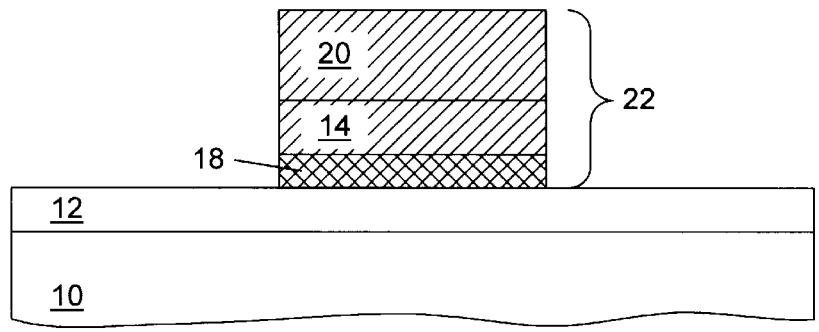
FIG. 5 is a partial cross-sectional view of the semiconductor topography wherein a stacked gate conductor is patterned having a diffusion barrier located in the first gate conductor layer.
Figure 6:
FIG. 6 is a partial cross-sectional view of the semiconductor topography in which LDD regions are formed in the substrate adjacent to the stacked gate conductor.
Figure 6:
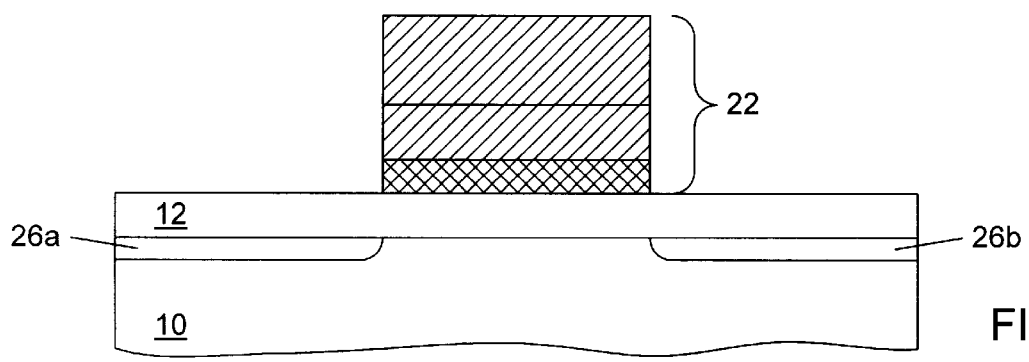
Figure 7:
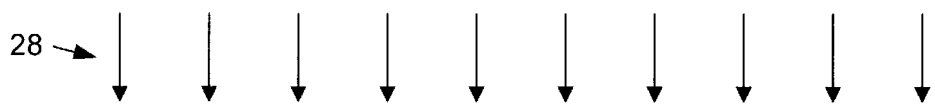
FIG. 7 is a partial cross-sectional view of the semiconductor topography in which opposed sidewall spacers are used to form source/drain regions in the substrate.
Figure 7:
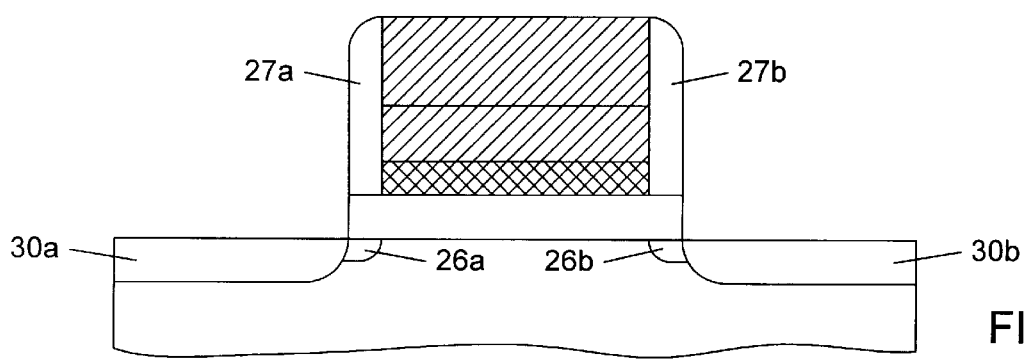

FIGS. 5–7 illustrate further steps in forming a diffusion barrier in a stacked gate conductor. FIG. 5 shows gate conductor 22, which is formed by patterning the first and second gate conductor layers according to well-known techniques. FIG. 6 depicts lightly doped source/drain (LDD) regions 26a and 26b formed on opposite sides of gate conductor 22. Gate conductor 22 serves as a mask for self-aligning implant 24. Implant 24 may include either p-type or n-type dopants forwarded into substrate 10. FIG. 7 shows the location of source and drain regions in a preferred embodiment. A spacer material is conformally deposited over the entire semiconductor topography of FIG. 6, including gate conductor 22 and the areas overlying LDD regions 26a and 26b. The spacer material then undergoes an anisotropic etch to form spacers 27a and 27b on opposed sidewalls of gate conductor 22. After formation of spacers 27a and 27b, implant 28 is performed, which results in the formation of source/drain regions 30a and 30b. During source/drain implants, gate conductor 22 and spacers 27a and 27b serve as a mask. The source/drain implants are of the same species as the LDD implants; however, the source/drain implants are of a greater dopant concentration and implanted to a greater depth than the LDD implants.

It will be appreciated by those skilled in the art having the benefit of this disclosure that the disclosed method is believed to be capable of forming transistors having stacked gate conductors containing diffusion barriers. Furthermore, it is also to be understood that the form of the invention shown and described is to be taken as exemplary, presently preferred embodiments. Various modifications and changes may be made to each and every processing step without departing from the spirit and the scope of the invention as set forth in the claims. It is intended that the following claims be interpreted to embrace all such modifications and changes and, accordingly, the specification and drawings are being regarded in an illustrative rather than a restrictive sense.

What is claimed is:

1. An integrated circuit, comprising:

a first gate conductor layer dielectrically spaced above a semiconductor substrate, wherein said first gate conductor layer comprises amorphous silicon;

argon atoms existing exclusively within said first gate conductor layer; and a second gate conductor layer adjacent said first gate conductor layer, wherein said second gate conductor layer comprises polysilicon.

2. The integrated circuit of claim 1, wherein said first gate conductor layer has a first thickness and said second gate conductor layer has a second thickness.

3. The integrated circuit of claim 2, wherein said second thickness is greater than said first thickness.

4. The integrated circuit of claim 2, wherein said argon atoms existing exclusively within said first gate conductor layer define an argon diffusion barrier having a thickness.

5. The integrated circuit of claim 4, wherein said thickness of said argon diffusion barrier is less than said first thickness of said first gate conductor layer.

6. The integrated circuit of claim 4, wherein said thickness of said argon diffusion barrier is equal to said first thickness of said first gate conductor layer.

7. The integrated circuit of claim 1, wherein said argon atoms have a uniform distribution within said first gate conductor layer.

8. The integrated circuit of claim 1, wherein said argon atoms have a peak concentration proximate an upper surface of said first gate conductor layer.

9. The integrated circuit of claim 1, wherein said argon atoms have a peak concentration proximate a lower surface of said first gate conductor layer.

* * * * *